United States Patent
Lin et al.

(10) Patent No.: US 7,375,572 B2
(45) Date of Patent: May 20, 2008

(54) CLAMPING CIRCUIT

(75) Inventors: Shang-Yi Lin, Hsinchu County (TW); Chen-Yu Hsiao, Pingtung County (TW)

(73) Assignee: Mediatek Inc., Hsin-Chu (TW)

( * ) Notice: Subject to any disclaimer, the term of this patent is extended or adjusted under 35 U.S.C. 154(b) by 147 days.

(21) Appl. No.: 11/425,158

(22) Filed: Jun. 20, 2006

(65) Prior Publication Data

US 2007/0008026 A1 Jan. 11, 2007

Related U.S. Application Data

(60) Provisional application No. 60/696,560, filed on Jul. 5, 2005.

(51) Int. Cl.
*H03L 5/00* (2006.01)
(52) U.S. Cl. ............................ 327/307; 330/9; 348/689
(58) Field of Classification Search ................ 327/307; 330/9; 348/689
See application file for complete search history.

(56) References Cited

U.S. PATENT DOCUMENTS

| | | | |
|---|---|---|---|
| 4,470,066 A * | 9/1984 | Wolber et al. .............. 348/691 |
| 5,027,017 A | 6/1991 | Fling | |
| 5,410,366 A | 4/1995 | Hostetler | |
| 5,497,201 A | 3/1996 | Ogawa et al. | |
| 5,510,854 A * | 4/1996 | Meunier ..................... 348/695 |
| 5,892,555 A | 4/1999 | Sohn | |
| 5,986,719 A | 11/1999 | Nakamura | |
| 6,008,864 A | 12/1999 | Nayebi et al. | |
| 6,130,719 A * | 10/2000 | Hebbalalu et al. .......... 348/529 |
| 7,196,565 B2 * | 3/2007 | Wu ............................ 327/307 |
| 2004/0021796 A1 | 2/2004 | Fang et al. | |

* cited by examiner

*Primary Examiner*—Kenneth B. Wells
(74) *Attorney, Agent, or Firm*—Thomas, Kayden, Horstemeyer & Risley

(57) ABSTRACT

A clamping circuit for restoring the DC level of video input signals. The clamping circuit comprises a coupling capacitor, a latch, a logic element, a charge switch, and a constant current source. The latch is coupled to the coupling capacitor to receive a video input signal therethrough and comprises a bias current source for generating first and second output signals in response to the AC-coupled signal and a reference voltage. The logic element receives the first and second output signals, generating a charging control signal to the charge switch. The charge switch, responsive to the charging control signal, is turned on to direct the current of the bias current source to the coupling capacitor, raising the level of the AC-coupled signal. Meanwhile, the constant current source continuously discharges the coupling capacitor slowly.

22 Claims, 10 Drawing Sheets

CLAMPING CIRCUIT

CROSS REFERENCE TO RELATED APPLICATIONS

This application claims the benefit of U.S. provisional application No. 60/696,560 filed Jul. 5, 2005, and entitled "A Novel Latch Clamping Circuit for Video Applications".

BACKGROUND

The invention relates to a clamping circuit, and more specifically to a clamping circuit for restoring the DC level of video signals.

Video signals are processed in many different applications including televisions, video capture equipment, VCRs and camcorders. When transmitting video signals, the D.C. reference level thereof may be lost. Therefore, a clamping circuit is generally built into video receivers to restore the DC level of video signals to a reference level within the supply range of the video receivers.

FIG. 1A is a schematic diagram of a conventional clamping circuit 10, having a coupling capacitor C1, two current sources 14 and 16, and a comparator 18. The coupling capacitor C1 receives a video input signal Vin to be clamped. The comparator 18 coupled between the coupling capacitor C1 and the second current source 16, receives the video input signal Vin via the coupling capacitor C1 at a positive input terminal thereof and a reference voltage Vref at a negative input terminal thereof, thereby generating a charging control signal. Moreover, the current source 14 is coupled between the coupling capacitor C1 and ground, and the current source 16 coupled between a power line Vcc and the coupling capacitor C1, receives the charging control signal from the comparator 18. When receiving the video input signal Vin, the comparator 18 compares the magnitude of the video input signal Vin to that of the reference voltage Vref, and generates the charging control signal in accordance with the comparison result to the second current source 16. For example, when the AC-coupled signal Vac is less than the reference voltage Vref, the comparator 18 generates the charging control signal in a LOW state (i.e. logic '0'), turning on the current source 16, thereby charging the coupling capacitor C1 and raising the level of the AC-coupled signal Vac. When the video input signal Vin exceeds the reference voltage Vref, the current source 16 is turned off with the charging control signal in a HIGH state (i.e. logic '1'). The current source 14 is a weak current source, continuously discharging the coupling capacitor C1, lowering the level of the video input signal Vin slowly. FIGS. 1B and 1C are exemplary waveforms of the video input signal Vin before and after being clamped by the clamping circuit 10 respectively. Comparing FIG. 1B with FIG. 1C, it can be found that the lowest level of the video input signal Vin is clamped to the predetermined reference voltage level Vref by the clamping circuit 10.

The conventional clamping circuit, however, requires an extra current source such as current source 16 to charge the coupling capacitor; this may increase the required chip area and cost.

SUMMARY

The invention is generally directed to a clamping circuit restoring the DC level of video signals. An exemplary embodiment of a clamping circuit comprises a coupling capacitor, a latch, a logic element, a charge switch, and a constant current source. The coupling capacitor comprises a first terminal, receiving an input signal and a second terminal outputting an AC-coupled signal. The latch, coupled to the second terminal, comprises a bias current source coupled to a power line, generating a first output signal at a first node and a second output signal at a second node in response to the AC-coupled signal and a reference voltage. The logic element receives the first and second output signals, generating a charging control signal in accordance with the first and second output signals. The charge switch, coupled between the second terminal and the bias current source, is turned on by the charging control signal to direct the current of the bias current source to the coupling capacitor, raising the level of the AC-coupled signal. The constant current source is coupled between the second terminal and ground.

Another clamping circuit is also provided. The clamping circuit comprises a coupling capacitor, a latch, a logic element, a charge switch, and a constant current source. The coupling capacitor comprises a first terminal receiving an input signal and a second terminal outputting an AC-coupled signal. The latch coupled to the second terminal comprises a bias current source, a first PMOS transistor, and a second PMOS transistor. The bias current source is coupled to a power line. The first PMOS transistor has a gate receiving the AC-coupled signal, a drain generating a first output signal at a first node, and a source coupled to the bias current source. The second PMOS transistor has a gate receiving a reference voltage, a drain generating a second output signal at a second node, and a source coupled to the bias current source, wherein the first and second output signals are generated in response to the AC-coupled signal and the reference voltage. The logic element receives the first and second output signals to generate a charging control signal in accordance with the first and second output signals. The charge switch, coupled between the second terminal and the bias current source, is turned on in response to the charging control signal to direct the current of the bias current source to the coupling capacitor when the level of the AC-coupled signal is less than that of the reference voltage, raising the level of the AC-coupled signal. The constant current source, coupled between the second terminal and ground, continuously discharges the coupling capacitor to lower the level of the AC-coupled signal.

DESCRIPTION OF THE DRAWINGS

The invention will be described by way of exemplary embodiments, but not limitations, illustrated in the accompanying drawings in which like references denote similar elements, and in which.

DETAILED DESCRIPTION

Figure 1A:
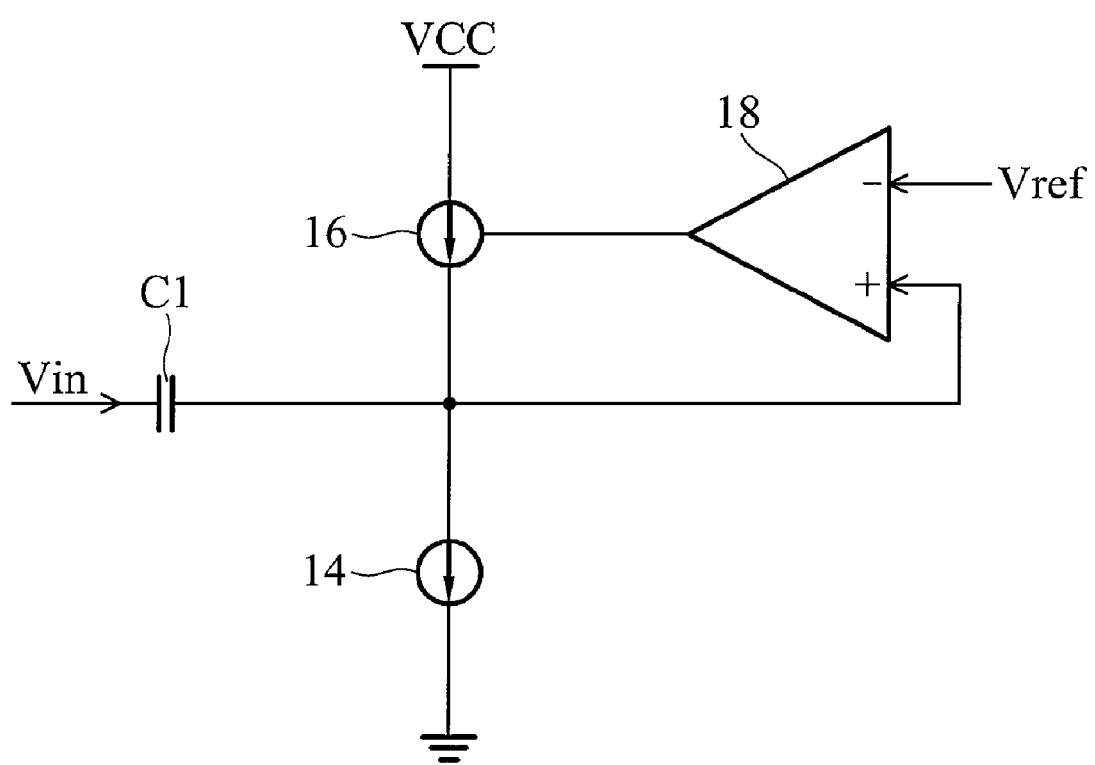
FIG. 1A is a schematic diagram of a conventional clamping circuit.
Figure 1B:
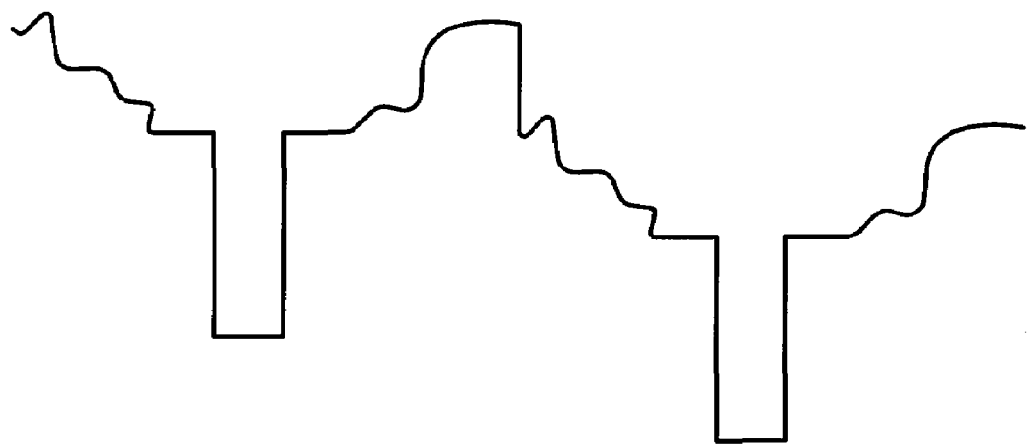
FIGS. 1B and 1C are waveforms of the video input signal Vin before and after clamping by the clamping circuit in FIG. 1A respectively.
Figure 1C:
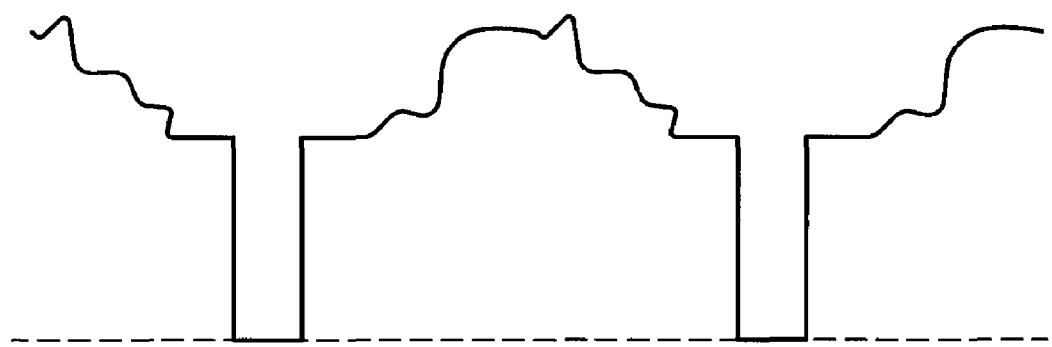
Figure 2:
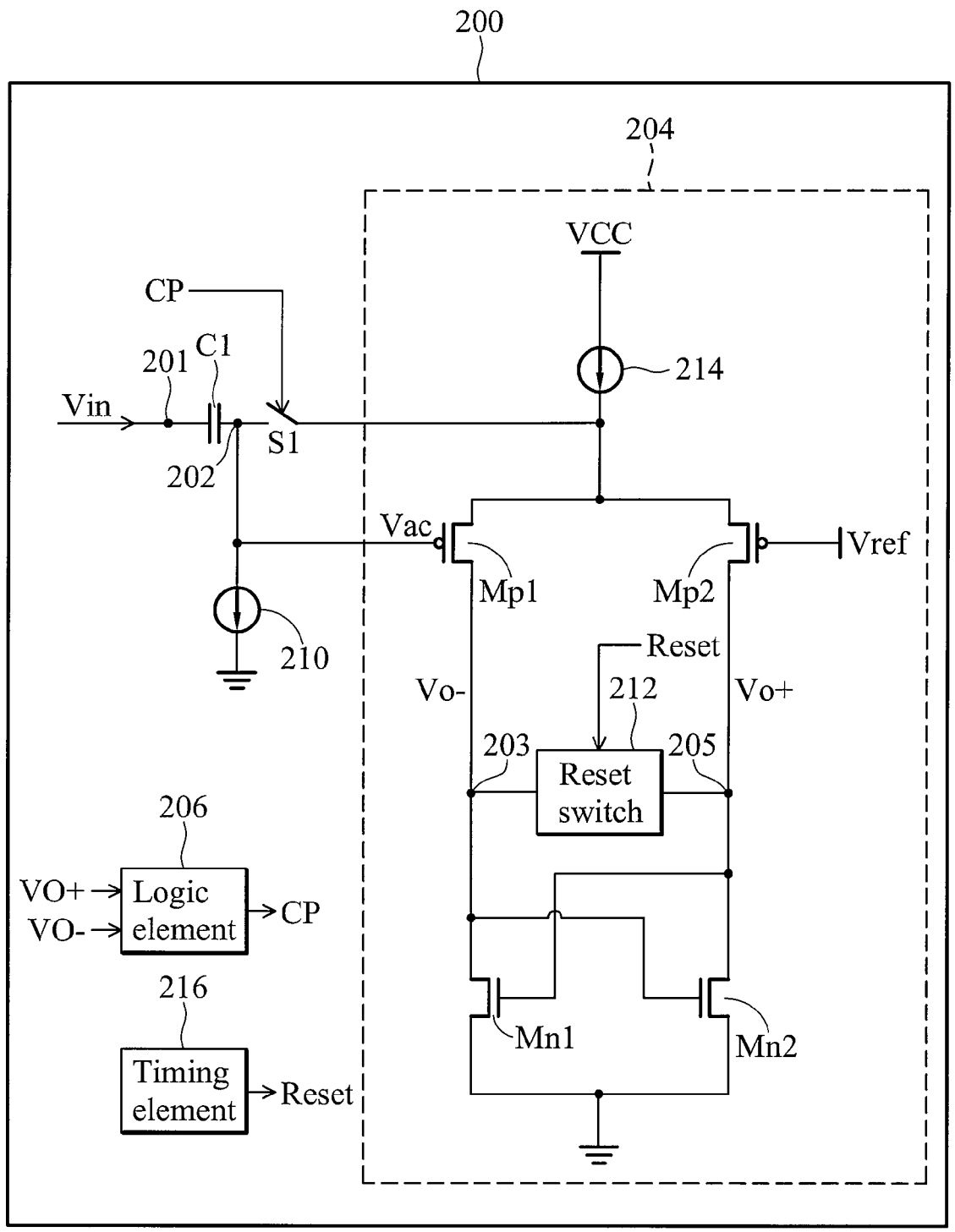
FIG. 2 is a schematic diagram of a clamping circuit according to an embodiment of the invention.

FIG. 2 shows a clamping circuit 200 according to an embodiment of the invention, comprising a coupling capacitor C1, a latch 204, a logic element 206, a charge switch S1, and a constant current source 210. The coupling capacitor C1 receives a video input signal Vin at a terminal 201 thereof and outputs an AC-coupled signal Vac at a terminal 202 thereof. The latch 204, coupled to the terminal 202, comprises two PMOS transistors, Mp1 and Mp2, two NMOS transistors, Mn1 and Mn2, and a bias current source 214, generating an output signal VO− at a node 203 and an output signal VO+ at a node 205 in response to the AC-coupled signal Vac and a reference voltage Vref. The PMOS transistor Mp1 has a gate coupled to the constant current source 210 and the coupling capacitor C1 at the terminal 202, receiving the AC-coupled signal Vac, a source tied together with the source of the transistor Mp2 to the bias current source 214, and a drain coupled to the gate of the NMOS transistor Mn2, generating the output signal VO− at the node 203. The PMOS transistor Mp2 has a gate receiving the reference voltage Vref, and a drain coupled to the gate of the NMOS transistor Mn1, generating the output signal VO+ at the node 205. The sources of the NMOS transistors Mn1 and Mn2 are coupled together to ground. The bias current source 214 is coupled between a power line Vcc and the charge switch S1 at the terminal 202. The constant current source 210 is coupled between ground and the coupling capacitor C1 at the terminal 202. The logic element 206 receives the output signals VO− and VO+ to generate a charging control signal CP to the charge switch S1, coupled between the bias current source 214 and coupling capacitor C1 at the terminal 202. A reset switch 212, coupled between the nodes 203 and 205, is controlled by a reset signal. The reset signal is provided by a timing element 216 having an oscillator, such as a 27 MHz oscillator, wherein the reset signal activates operation of the clamping circuit 200. For example, when the reset signal is deasserted (i.e., logic '0'), the coupling circuit 200 starts to clamp the DC level of the AC-coupled signal Vac to the level of the reference voltage Vref. Conversely, when the reset signal is asserted (i.e., logic '1'), the reset switch 212 is turned to clamp the levels of the output signals VO+ and VO− as equal, clearing the previous status of the clamping circuit 200.

Figure 3A:
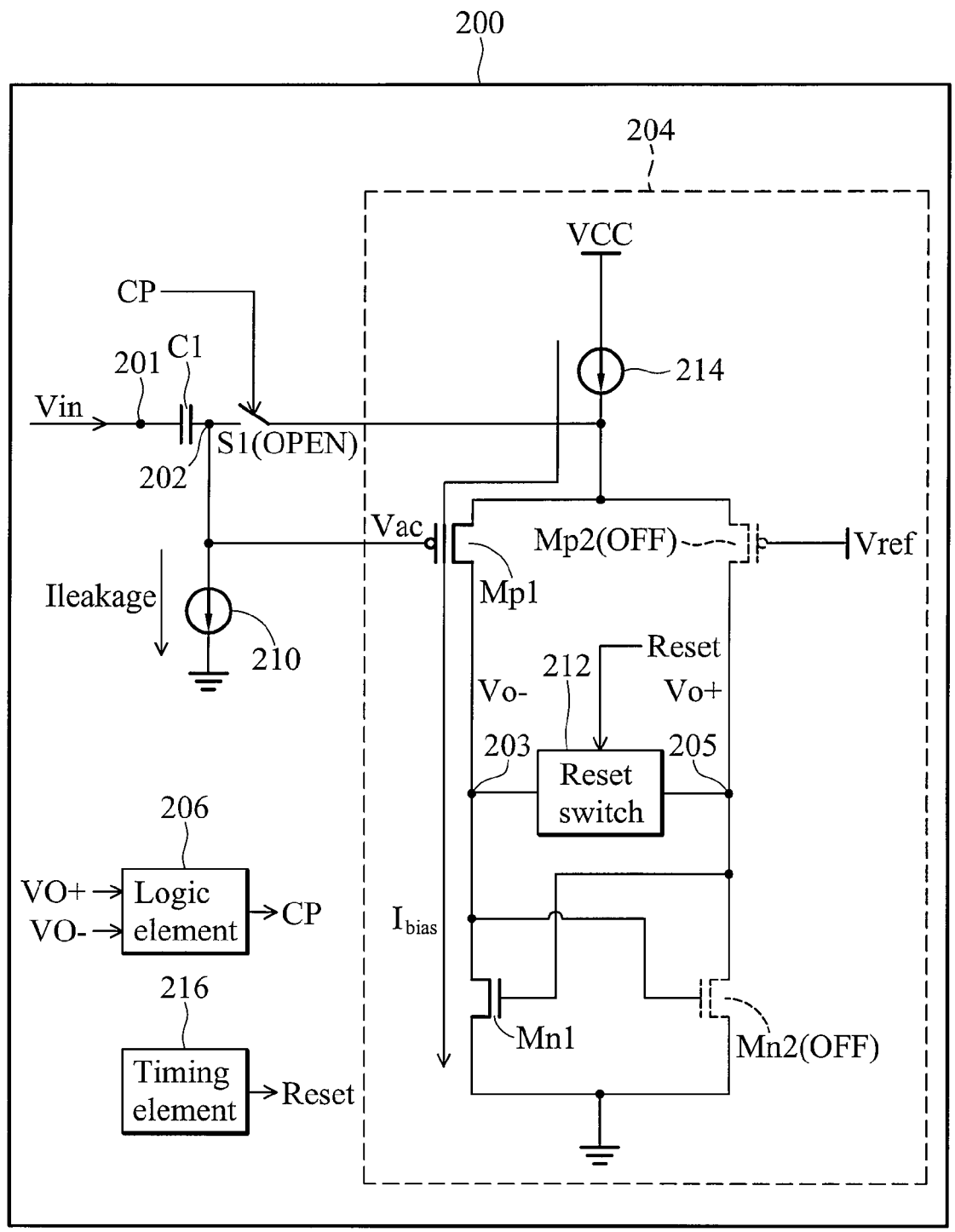
FIGS. 3A-3C are schematic diagrams illustrating the operation of the clamping circuit in FIG. 2 under different conditions.

FIG. 3A shows operation of the clamping circuit 200 when the reset signal is deasserted and the AC-coupled signal Vac exceeds the reference voltage Vref. When receiving the AC-coupled signal Vac, the latch 204 generates the output signals VO− and VO+ in accordance with the AC-coupled signal Vac and the reference voltage Vref. In this case, since the AC-coupled signal Vac exceeds the reference voltage Vref, the output signal VO− at the node 203 is logic '0' and the output signal VO+ at the node 205 is logic '1'. Hence, the NMOS transistor Mn2 is turned off such that the PMOS transistor Mp2 is also turned off. In this case, the gate to source voltages of the transistors Mn1 and Mn2 are made "low" enough and "high" enough respectively.

When receiving the output signals VO+ and VO−, the logic element 206 generates the charging control signal CP according to the levels of the output signals VO+ and VO− to turn the charge switch S1 one or off accordingly. For example, the charging control signal CP can be asserted to turn the charge switch S1 on when the output signal VO− exceeds the output signal VO+, and off when the output signal VO− is less than or equal to the output signal VO+.

Figure 4A:
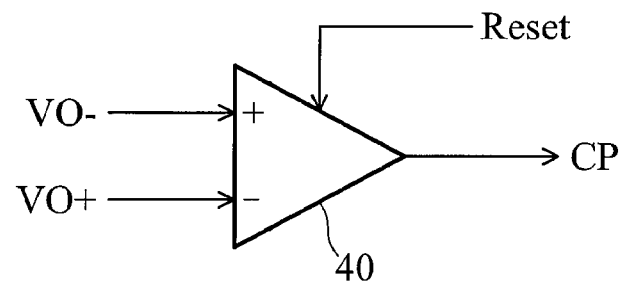
FIG. 4A is a schematic diagram illustrating an embodiment of the logic element in FIG. 2.

FIG. 4A is a schematic diagram illustrating an embodiment of the logic element 206 in FIG. 2. The logic element 206 comprises a comparator 40 receiving the output signals VO− and VO+ at its positive and negative terminals respectively and generating the charging control signal CP to the charge switch S1. The comparison status of the comparator 40 is cleared when the reset signal is asserted. When receiving the output signals VO+ and VO− during deassertion of the reset signal, the comparator 40 compares the output signals VO− and VO+. In the condition in FIG. 3A, wherein the output signal VO− is less than the output signal VO+, the charging control signal CP is deasserted (i.e. logic '0') by the comparator 40 so that the charge switch S1 is turned off.

Figure 4B:
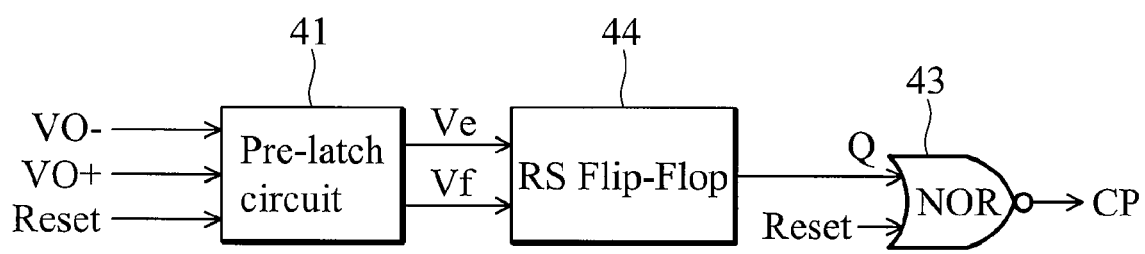
FIG. 4B is a block diagram illustrating another embodiment of the logic element in FIG. 2.

FIG. 4B is a block diagram illustrating another embodiment of the logic element 206 in FIG. 2. The logic element 206 in FIG. 4B comprises a pre-latch circuit 41, a RS Flip-Flop 44 and a NOR gate 43. The pre-latch circuit 41 receives the output signals VO−, VO+ and the reset signal to generate amplified output signals Ve and Vf. The RS Flip-Flop 44 receives the amplified output signals Ve and Vf, generating an inverted signal Q to the NOR gate 43. The NOR gate 43 receives the inverted signal Q and the reset signal, generating the charging control signal CP to the charge switch S1.

Figure 5:
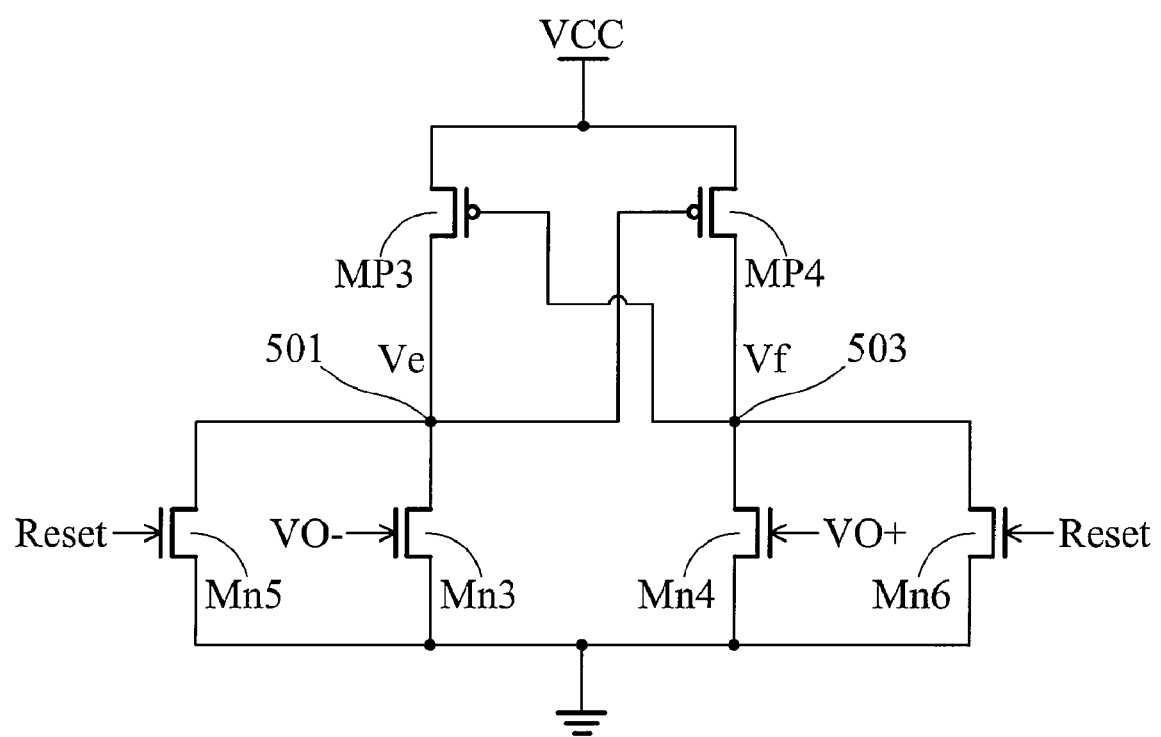
FIG. 5 is a schematic diagram of the pre-latch circuit in FIG. 4B.

FIG. 5 is a schematic diagram of the pre-latch circuit 41 shown in FIG. 4B. The pre-latch circuit 41 comprises four NMOS transistors Mn3~Mn6 and two PMOS transistors Mp3 and Mp4. The NMOS transistor Mn3 comprises a gate receiving the output signal VO− and a drain generating the amplified output signal Ve at a node 501, and the NMOS transistor Mn4 comprises a gate receiving the output signal VO+, and a drain generating the amplified output signal Vf at a node 503. The sources of the NMOS transistors Mn5 and Mn6 receive the reset signal, and the drains thereof are coupled to the nodes 501 and 503 respectively. The sources of the NMOS transistors Mn5 and Mn6 are tied together with the sources of the NMOS transistors Mn3 and Mn4 to ground. The PMOS transistor Mp3 comprises a gate coupled to the node 503, a source coupled to the power line Vcc and a drain coupled to the node 501. The PMOS transistor Mp4 comprises a gate coupled to the node 501, a source coupled to the power line Vcc and a drain coupled to the node 503.

When the reset signal is deasserted as assumption in FIG. 3A, the transistors Mn5 and M6 are turned off. Since the output signals VO− and VO+ are logic '0' and '1' respectively, the transistor Mn4 is turned on, pulling the amplified output signal Vf at node 503 to logic '0', thereby turning on the PMOS transistor Mp3. Thus, with the drain current of the transistor Mp3, the amplified output signal Ve at the node 501 is pulled to logic '1', thereby turning the PMOS transistor Mp4 off.

Figure 6:
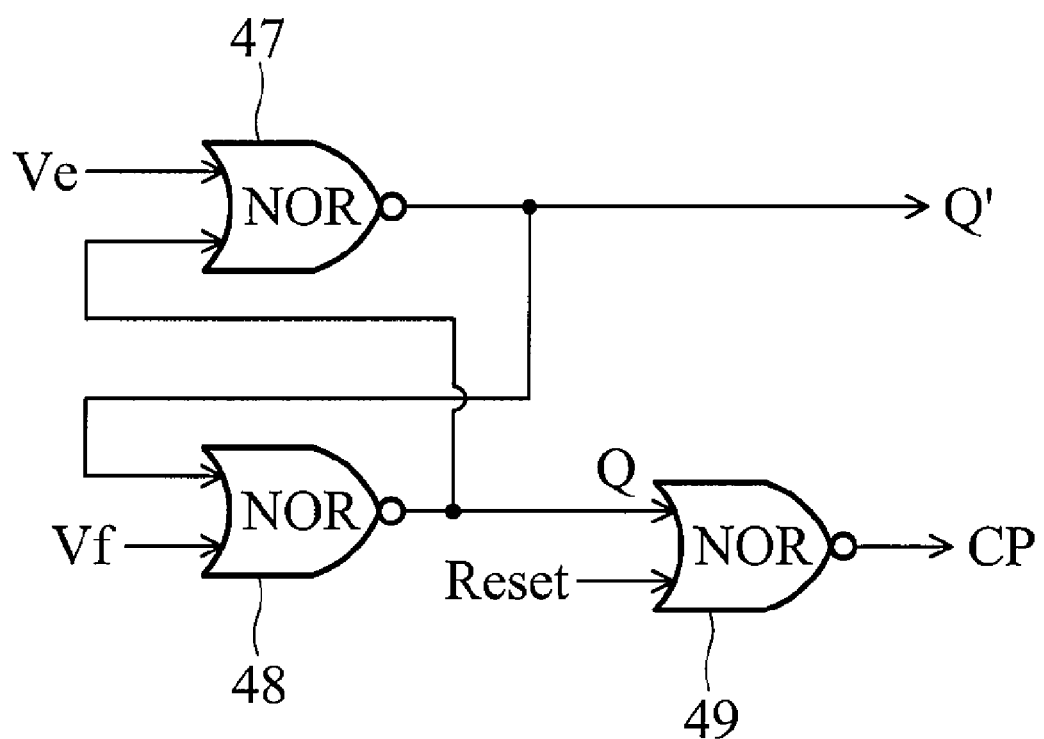
FIG. 6 is a schematic diagram of the RS Flip-Flop and the NOR gate in FIG. 4B.

FIG. 6 is a schematic diagram of the RS flip-flop 44 and the NOR gate 43 in FIG. 4B, implemented by feeding the outputs of two NOR gates 47 and 48, Q' and Q, respectively back to the other NOR gates input, wherein the NOR gate 47 receives the amplified output signal Ve at one of its input terminals and the NOR gate 48 receives the amplified output signal Vf at one of its input terminals. The NOR gate 49 receives the output Q of the NOR gate 48 at one of its input terminals and the reset signal at the other input terminal to generate the charging control signal CP. The operation of the RS flip-flop 44 is summarized in Table 1, wherein it can be observed that when the signals Vf and Ve are logic '0' and '1' respectively, the output signal Q of the NOR gate 48 is logic '1'. When receiving the output signal Q of the NOR gate 48, the NOR gate 49 generates the charging control signal CP accordingly. The operation of the NOR gate 49 is summarized in Table 2, wherein it can be found that when the signal Q is logic '1' and the reset signal is logic '0', the charging control signal CP is deasserted by the NOR gate 49, thereby turning off the charge switch S1.

TABLE 1

| Vf | Ve | Q | Q̄ |
|---|---|---|---|
| 0 | 0 | Q | Q' |
| 0 | 1 | 1 | 0 |
| 1 | 0 | 0 | 1 |
| 1 | 1 | ? | ? |

TABLE 2

| Reset | Q | CP |
|---|---|---|
| 0 | 0 | 1 |
| 0 | 1 | 0 |
| 1 | 0 | 0 |
| 1 | 1 | 0 |

Since the transistors Mp2 and Mn2 and the charge switch S1 are turned off, the current $I_{bias}$ of the bias current source 214 is directed to ground as shown in FIG. 3A. Therefore, the coupling capacitor C1 is not charged when the AC-coupled signal Vac is greater than the reference voltage Vref during deassertion of the reset signal, whereas the constant current source 210 continuously directs a small leakage current $I_{leakage}$ away from the coupling capacitor C1, lowering the level of AC-coupled signal Vac.

Figure 3B:
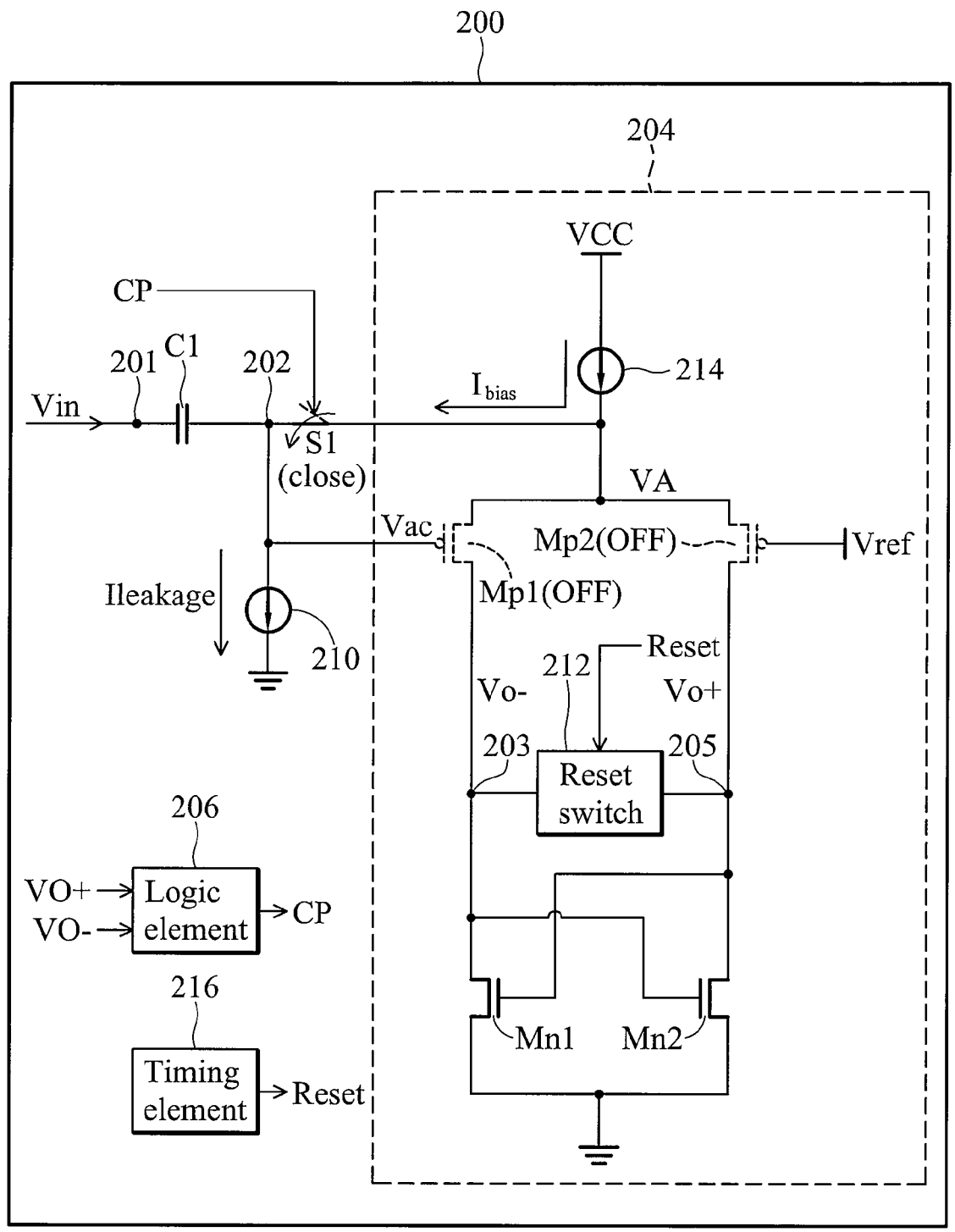

FIG. 3B shows operation of the clamping circuit 200 when the reset signal is deasserted and the AC-coupled signal Vac is less than the reference voltage Vref. When receiving the AC-coupled signal Vac, the output signals VO− at the node 203 and VO+ at node 205 are pulled to logic '1' and logic '0' respectively because the AC-coupled signal Vac is less than the reference voltage Vref. Then, the logic element 206 then assert the charging control CP to the charge switch S1 (i.e. CP=logic '1') to turn on the charge switch S1. For example, in the logic element 206 shown in FIG. 4A, the charging control signal CP generated by the comparator 40 is asserted (i.e. logic '1') to turn on the charge switch S1.

Moreover, in the pre-latch circuit 41 shown in FIG. 4B and FIG. 5, because the reset signal is logic '0', the transistors Mn5 and Mn6 are turned off. The transistor Mn3 is turned on, pulling the amplified output signal Ve at node 501 to logic '0', thereby turning on the PMOS transistor Mp4 since the output signals VO− and VO+ are logic '1' and '0' respectively. Thus, with the drain current of the transistor Mp4, the amplified output signal Vf at the node 503 is pulled to logic '1', thereby turning off the PMOS transistor Mp3. It can be observed from Table 1 that when the signals Vf and Ve are logic '1' and '0' respectively, the input signal Q of the NOR gate 43 is logic '0'. Thus, according to Table 2, when the signal Q is logic '0' and the reset signal is logic '0', the charging control signal CP is asserted by the NOR gate 43, thereby turning on the charge switch S1.

When the charge switch S1 is turned on, the gate voltage of the transistor Mp1 equaled to its source voltage, turning off the PMOS transistor Mp1. The source voltage of the transistor Mp2, equal to the AC-coupled signal Vac, is less than the reference voltage Vref at its gate, such that the PMOS transistor Mp2 is also turned off. Consequently, the current $I_{bias}$ of the bias current source 214 is directed to the coupling capacitor C1, charging the capacitor C1 and raising the level of the AC-coupled signal Vac. At the same time, as the constant current source 210 directs the small leakage current $I_{leakage}$ away from the coupling capacitor C1, the level of the AC-coupled signal Vac is still raised since the current $I_{leakage}$ is much smaller than the current $I_{bias}$.

Figure 3C:
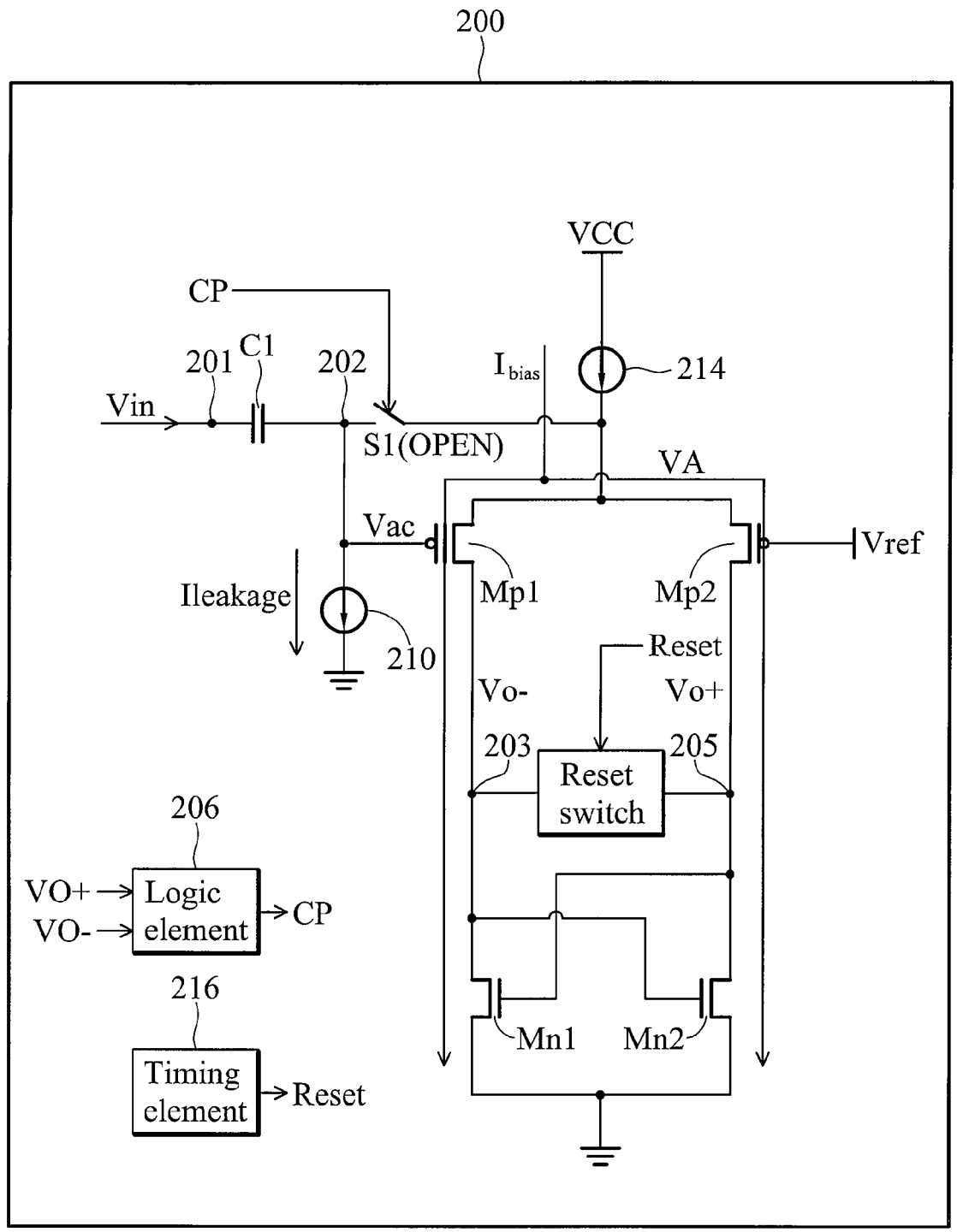

FIG. 3C shows the reset operation of the clamping circuit 200. When the reset signal is asserted, i.e., the reset signal is logic '1', the levels of the output signals VO− and VO+ are equalized to clear the previous clamping status and the logic element 206, such as the embodiments shown in FIGS. 4A and 4B, deasserts the charging control signal CP to turn off the charge switch S1. Consequently, the current $I_{bias}$ of the bias current source 214, flows to ground as shown in FIG. 3C, without charging the coupling capacitor C1.

Figure 7:
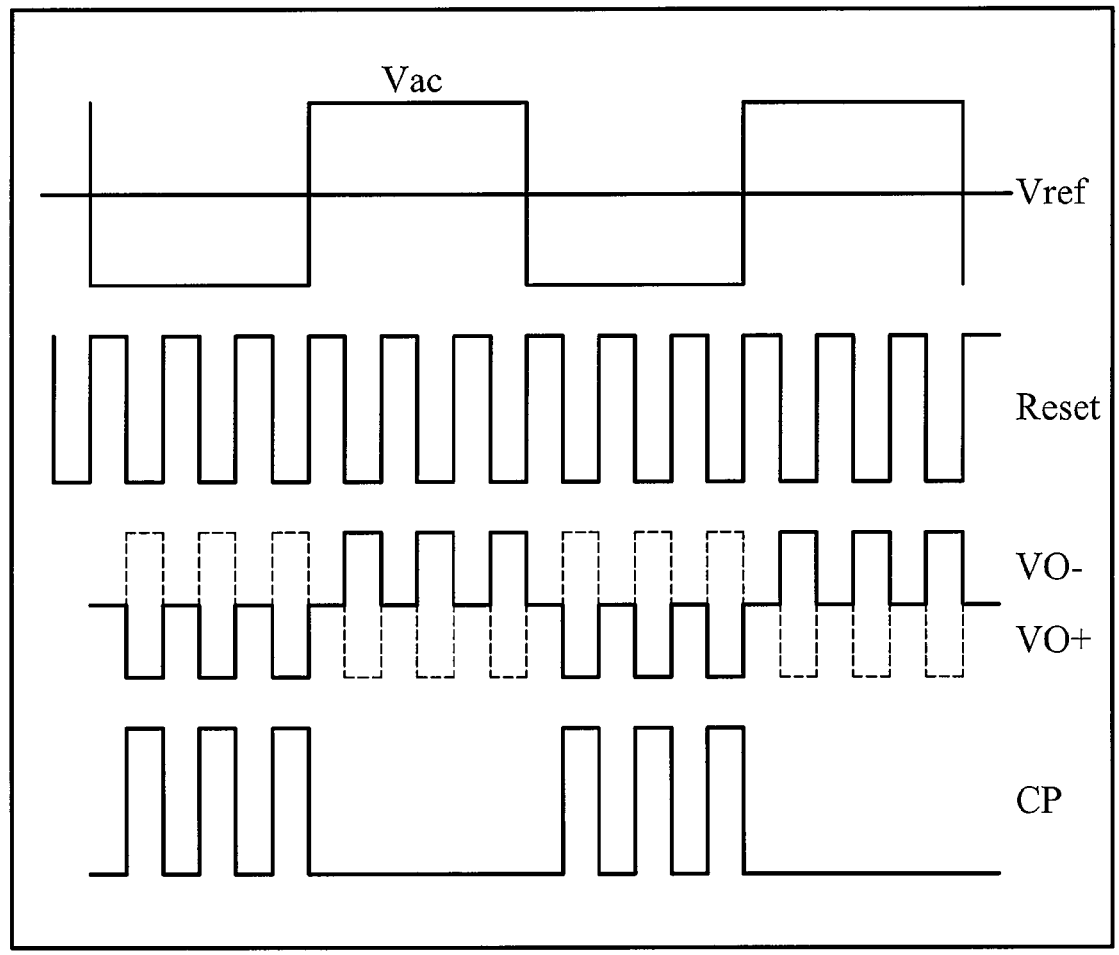
FIG. 7 is a waveform diagram illustrating the operational characteristics of the clamping circuit in FIG. 2.

FIG. 7 is a waveform diagram illustrating operational characteristics of the clamping circuit 200 in FIG. 2, wherein it can be observed from the FIG. 7 that the output signals VO+ (indicated by solid line) and VO− (indicated by dashed line) are clamped to equal during assertion of the reset signal. When the reset signal is deasserted, the clamping circuit starts to clamp the AC-coupled signal Vac to the level of the reference voltage Vref. The charging control signal CP is asserted to turn on the charge switch S1 to direct the bias current $I_{bias}$ to charge the coupling capacitor C1 when the AC-coupled signal Vac is less than the reference voltage Vref. Conversely, when the AC-coupled signal Vac exceeds the reference voltage Vref, the charging control signal CP is deasserted to turn off the charge switch S1, not charging coupling capacitor C1. In the meantime, the constant current source 210 continuously directs the weak current $I_{leakage}$ away from the capacitor C1, lowering the level of the AC-coupled signal Vac.

In embodiments of the invention, a clamping circuit comprising a latch having a bias current source is used to charge the received video input signal with the bias current source, thereby clamping the DC level of the video input signal. Thus, there is no need for an external current source in the clamping circuit to raise the video input signal level, and chip area is reduced. Moreover, the bias current source is always on, with only the direction of the bias current source controlled to raise the video input signal level when necessary, unlike in conventional clamping circuits where the current source to charge the coupling capacitor is turned on or turned off in accordance with the video input signal level and the reference voltage level. Such switching operations increase operational time, delaying the operation of clamping circuits.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A clamping circuit comprising:
   a coupling capacitor comprising a first terminal receiving an input signal and a second terminal outputting an AC-coupled signal;
   a latch coupled to the second terminal, comprising a bias current source coupled to a power line, generating a first output signal at a first node and a second output signal at a second node in response to the AC-coupled signal and a reference voltage;

a logic element receiving the first and second output signals, generating a charging control signal in accordance with the first and second output signals;

a charge switch coupled between the second terminal and the bias current source, turned on by the charging control signal to direct the current of the bias current source to the coupling capacitor, raising the level of the AC-coupled signal; and a constant current source coupled between the second terminal and ground.

2. The clamping circuit as claimed in claim 1, wherein the latch further comprises:

a first PMOS transistor having a gate receiving the AC-coupled signal, a drain generating the first output signal at the first node, and a source coupled to the bias current source; and a second PMOS transistor having a gate receiving the reference voltage, a drain generating the second output signal at the second node, and a source coupled to the bias current source.

3. The clamping circuit as claimed in claim 2, wherein the latch further comprises:

a first NMOS transistor having a gate coupled to the second node, a drain coupled to the first node, and a source coupled to ground; and a second NMOS transistor having a gate coupled to the first node, a drain coupled to the second node, and a source coupled to ground.

4. The clamping circuit as claimed in claim 1, wherein the charge switch is turned on in response to the charging control signal generated by the logic element when the level of the AC-coupled signal is less than that of the reference voltage.

5. The clamping circuit as claimed in claim 1, further comprising a reset switch coupled between the first and second nodes, controlled by a reset signal.

6. The clamping circuit as claimed in claim 5, wherein the reset switch is turned on during assertion of the reset signal to clamp the levels of the first and second output signals to equal.

7. The clamping circuit as claimed in claim 5, wherein the clamping circuit further comprises a timing element having an oscillator generating the reset signal.

8. The clamping circuit as claimed in claim 1, wherein the constant current source is operative to continuously discharge the coupling capacitor, lowering the level of the AC-coupled signal.

9. The clamping circuit as claimed in claim 1, wherein the logic element comprises a comparator comparing the first and second output signals to generate the charging control signal in accordance with the comparison result.

10. The clamping circuit as claimed in claim 9, wherein charging control signal is asserted by the comparator to turn on the charge switch when the level of the first output signal exceeds that of the second output signal.

11. The clamping circuit as claimed in claim 5, wherein the logic element comprises:

a pre-latch circuit receiving the first and second output signals and reset signal, generating first and second amplified output signals in accordance with the first and second output signals;

a RS Flip-Flop coupled to the pre-latch circuit, responsive to the first and second amplified output signals to generate an inverted signal; and a first NOR gate coupled to the RS Flip-Flop, receiving the inverted signal and the reset signal, generating the charging control signal.

12. The clamping circuit as claimed in claim 11, wherein the pre-latch circuit comprises:

a third NMOS transistor having a gate receiving the first output signal, a drain generating the first amplified output signal at a third node, and a source coupled to ground;

a fourth NMOS transistor having a gate receiving the second output signal, a drain generating the second amplified output signal at a fourth node, and a source coupled to ground;

a third PMOS transistor having a gate coupled to the fourth node, a source coupled to the power line, and a drain coupled to the third node;

a fourth PMOS transistor having a gate coupled to the third node, a source coupled to the power line, and a drain coupled to the fourth node;

a fifth NMOS transistor having a gate receiving the reset signal, a drain coupled to the third node, and a source coupled to ground; and a sixth NMOS transistor having a gate receiving the reset signal, a drain coupled to the fourth node, and a source coupled to ground.

13. The clamping circuit as claimed in claim 11, wherein the RS Flip-Flop comprises second and third NOR gates receiving the first and second amplified output signals respectively, wherein the third NOR gate generates the inverted signal to the first NOR gate.

14. A clamping circuit comprising:

a coupling capacitor comprising a first terminal receiving an input signal and a second terminal outputting an AC-coupled signal;

a latch coupled to the second terminal, comprising:

a bias current source coupled to a power line;

a first PMOS transistor having a gate receiving the AC-coupled signal, a drain generating a first output signal at a first node, and a source coupled to the bias current source; and a second PMOS transistor having a gate receiving a reference voltage, a drain generating a second output signal at a second node, and a source coupled to the bias current source;

wherein the first and second output signals are generated in response to the AC-coupled signal and the reference voltage;

a logic element receiving the first and second output signals, generating a charging control signal in accordance with the first and second output signals;

a charge switch coupled between the second terminal and the bias current source, turned on in response to the charging control signal to direct the current of the bias current source to the coupling capacitor when the level of the AC-coupled signal is less than that of the reference voltage, raising the level of the AC-coupled signal; and a constant current source coupled between the second terminal and ground, continuously discharging the coupling capacitor to lower the level of the AC-coupled signal.

15. The clamping circuit as claimed in claim 14, wherein the latch further comprises:

a first NMOS transistor having a gate coupled to the second node, a drain coupled to the first node, and a source coupled to ground; and a second NMOS transistor having a gate coupled to the first node, a drain coupled to the second node, and a source coupled to ground.

16. The clamping circuit as claimed in claim 14, further comprising a reset switch coupled between the first and second nodes, controlled by a reset signal.

17. The clamping circuit as claimed in claim 16, wherein the reset switch is turned on during assertion of the reset signal to clamp the levels of the first and second output signals to equal.

18. The clamping circuit as claimed in claim 16, wherein the clamping circuit further comprises a timing element having an oscillator generating the reset signal.

19. The clamping circuit as claimed in claim 14, wherein the logic element comprises a comparator comparing the first and second output signals to generate the charging control signal in accordance with the comparison result.

20. The clamping circuit as claimed in claim 14, wherein the logic element comprises:
  a pre-latch circuit receiving the first and second output signals and reset signal to generate first and second amplified output signals in accordance with the first and second output signals;
  a RS Flip-Flop coupled to the pre-latch circuit, responsive to the first and second amplified output signals to generate an inverted signal; and
  a first NOR gate coupled to the RS Flip-Flop, receiving the inverted signal and the reset signal, generating the charging control signal.

21. The clamping circuit as claimed in claim 20, wherein the pre-latch circuit comprises:
  a third NMOS transistor having a gate receiving the first output signal, a drain generating the first amplified output signal at a third node, and a source coupled to ground;
  a fourth NMOS transistor having a gate receiving the second output signal, a drain generating the second amplified output signal at a fourth node, and a source coupled to ground;
  a third PMOS transistor having a gate coupled to the fourth node, a source coupled to the power line, and a drain coupled to the third node;
  a fourth PMOS transistor having a gate coupled to the third node, a source coupled to the power line, and a drain coupled to the fourth node;
  a fifth NMOS transistor having a gate receiving the reset signal, a drain coupled to the third node, and a source coupled to ground; and
  a sixth NMOS transistor having a gate receiving the reset signal, a drain coupled to the fourth node, and a source coupled to ground.

22. The clamping circuit as claimed in claim 20, wherein the RS Flip-Flop comprises second and third NOR gates receiving the first and second amplified output signals respectively, wherein the third NOR gate generates the inverted signal to the first NOR gate.

\* \* \* \* \*